US008430967B2

(12) United States Patent
Shimmura et al.

(10) Patent No.: US 8,430,967 B2
(45) Date of Patent: Apr. 30, 2013

(54) HYDROPHOBICIZING APPARATUS, HYDROPHOBICIZING METHOD AND STORAGE MEDIUM

(75) Inventors: Satoshi Shimmura, Kumamoto (JP); Tetsuo Fukuoka, Kumamoto (JP); Takahiro Kitano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 328 days.

(21) Appl. No.: 12/859,927

(22) Filed: Aug. 20, 2010

(65) Prior Publication Data
US 2011/0045166 A1 Feb. 24, 2011

(30) Foreign Application Priority Data
Aug. 24, 2009 (JP) .................... 2009-193587

(51) Int. Cl.
C23C 16/00 (2006.01)

(52) U.S. Cl.
USPC ........................................ 118/726; 118/727

(58) Field of Classification Search .................. 118/726, 118/727
See application file for complete search history.

(56) References Cited

U.S. PATENT DOCUMENTS

| | | | | |
|---|---|---|---|---|
| 4,640,221 A | * | 2/1987 | Barbee et al. ................. | 118/689 |
| 4,700,660 A | * | 10/1987 | Levchenko et al. ........... | 118/726 |
| 4,947,789 A | * | 8/1990 | Hussla et al. ................. | 118/715 |
| 5,401,316 A | * | 3/1995 | Shiraishi et al. ............. | 118/689 |
| 5,953,634 A | * | 9/1999 | Kajita et al. .................. | 438/687 |
| 6,663,716 B2 | * | 12/2003 | Loan et al. .................... | 118/726 |
| 2002/0009545 A1 | * | 1/2002 | Hayashi et al. ............ | 427/248.1 |

FOREIGN PATENT DOCUMENTS

| | | |
|---|---|---|
| JP | 03-184320 A | 8/1991 |
| JP | 08-227848 A | 9/1996 |
| JP | 08-288242 A | 11/1996 |
| JP | 11-121356 A | 4/1999 |
| JP | 11-214292 A | 8/1999 |

OTHER PUBLICATIONS

Japanese Office action for 2009-193587 dated Nov. 8, 2011.

* cited by examiner

Primary Examiner — Keath Chen
(74) Attorney, Agent, or Firm — Pearne & Gordon LLP

(57) ABSTRACT

The hydrophobicizing apparatus includes a vaporizing surface forming member of which surface is located in a vaporizing room; a vaporizing surface heating unit that heats the vaporizing surface forming member; a liquid chemical supply port that supplies a liquid chemical for a hydrophobicizing process on the surface of the vaporizing surface forming member; a gas inlet port that introduces a carrier gas into the vaporizing room; an outlet port that supplies a hydrophobicizing gas vaporized in the vaporizing room; and a processing chamber that performs the hydrophobicizing process on a substrate accommodated therein by the hydrophobicizing gas supplied through the outlet port. With this configuration, the hydrophobicizing gas of a high concentration can be supplied onto the substrate. Further, since the stored liquid chemical is not in contact with the carrier gas when a process is not being performed, degradation of the liquid chemical is suppressed.

10 Claims, 12 Drawing Sheets

HYDROPHOBICIZING APPARATUS, HYDROPHOBICIZING METHOD AND STORAGE MEDIUM

CROSS-REFERENCE TO RELATED APPLICATION

This application claims the benefit of Japanese Patent Application No. 2009-193587 filed on Aug. 24, 2009, the entire disclosures of which are incorporated herein by reference.

FIELD OF THE INVENTION

The present disclosure relates to a hydrophobicizing apparatus, a hydrophobicizing method and a storage medium.

BACKGROUND OF THE INVENTION

Conventionally, in a manufacturing process of a semiconductor device, a LCD substrate, or the like, one of processing steps in a resist pattern forming process is a hydrophobicizing process performed on, e.g., a semiconductor wafer (hereinafter, simply referred to as a wafer). The hydrophobicizing process is conducted to change a hydrophilic surface of a wafer to a hydrophobic surface by spraying vapor of HMDS (hexamethyldisilazane) onto the surface of the wafer in order to improve adhesiveness between a base film and a resist film prior to coating the wafer with resist. The hydrophobicizing process may be usually performed on the surface of the wafer and a bevel portion (an end surface of outer periphery) of the wafer. By the benefit of the hydrophobicizing process, if there is performed a liquid immersion exposure process in which an exposure is carried out through water between the wafer and an exposure apparatus, it is advantageous that peeling of the resist film may be suppressed.

Patent Document 1 discloses an apparatus for performing such a hydrophobicizing process on a wafer. In this apparatus, HMDS used as a liquid chemical for a liquid source is stored in a tank, and a carrier gas supply source and a processing chamber configured to perform the hydrophobicizing process are connected to the tank via respective pipes. A carrier gas is supplied from the carrier gas supply source into the tank, so that the HMDS within the tank is bubbled and vaporized. The vaporized HMDS is carried into the processing chamber by the carrier gas.

In the meanwhile, in order to meet a demand for enhancement of throughput in the manufacturing process of the semiconductor device, processing time of the hydrophobicizing process needs to be shortened. Thus, it can be considered to improve throughput by supplying a HMDS gas (hydrophobicizing gas) of a relatively high concentration to the wafer.

Since a hydrophobicizing gas generation rate is proportional to a contact area between the HMDS and the carrier gas, it may be considered to improve throughput by using a large-size tank storing the HMDS and thus supplying a high-concentration HMDS gas to the wafer. Since, however, such a large-size tank may not be placed adjacent to the processing chamber, a pipe for connecting the processing chamber and the tank would be lengthened. If the length of the pipe is increased, the hydrophobicizing gas containing the HMDS of the relatively high concentration would be condensed while it flows through the pipe. Therefore, it is concerned that a hydrophobicizing gas of an expected concentration is not supplied to the wafer. Further, since the pipe needs to be filled with the hydrophobicizing gas whenever a wafer process is performed, sufficient throughput improvement may not be achieved. As a countermeasure to such a condensation problem, installation of a heating unit at the pipe may be considered. In such a case, however, the apparatus may be scaled up and a foot print of the apparatus may be increased.

Moreover, since the HMDS is always kept in contact with the supplied carrier gas within the tank, the HMDS and the carrier gas may react to each other in the tank if the generation of the hydrophobicizing gas is stopped for some time, resulting in degradation of the HMDS liquid. If the deterioration of the HMDS liquid occurs, the surface of the wafer may not be hydrophobicized sufficiently, and, thus, it becomes difficult to improve adhesiveness of the resist film.

Patent Document 1: Japanese Patent Laid-open Publication H11-214292 (paragraphs [0036], [0037], and [0048]).

BRIEF SUMMARY OF THE INVENTION

In view of the foregoing, the present disclosure provides a hydrophobicizing apparatus capable of vaporizing a liquid chemical with high efficiency and thus supplying a hydrophobicizing gas of a high concentration to a substrate while suppressing degradation of the liquid chemical, and also provides a hydrophobicizing method and a storage medium storing a computer program for executing the hydrophobicizing method.

In accordance with one aspect of the present disclosure, there is provided a hydrophobicizing apparatus including: a vaporizing surface forming member of which surface is located in a vaporizing room; a vaporizing surface heating unit that heats the vaporizing surface forming member; a liquid chemical supply port that supplies a liquid chemical for a hydrophobicizing process on the surface of the vaporizing surface forming member; a gas inlet port that introduces a carrier gas into the vaporizing room; an outlet port that supplies a hydrophobicizing gas vaporized in the vaporizing room; and a processing chamber that performs the hydrophobicizing process on a substrate accommodated therein by the hydrophobicizing gas supplied through the outlet port.

By way of example, the vaporizing room may be provided on a ceiling plate of the processing chamber; the vaporizing surface forming member may be formed to have a shape enlarged downward; and the liquid chemical supply port may be located above the vaporizing surface forming member. Further, the vaporizing surface forming member may be provided with a groove in which the liquid chemical is to be diffused by a capillary action. The hydrophobicizing apparatus may further include a gas heating unit that heats the carrier gas before the carrier gas is introduced into the vaporizing room. Further, the hydrophobicizing apparatus may further include, for example, a concentration detector that detects a concentration of the hydrophobicizing gas supplied through the outlet port; and a control unit that outputs a control signal based on a detection value of the concentration detector so as to increase a flow rate of the liquid chemical supplied to the vaporizing room through the liquid chemical supply port. In this case, the control unit may output a control signal so as to increase a heating temperature of the vaporizing surface heating unit when the detection value of the concentration detector is lower than a setting value even after the flow rate of the liquid chemical is increased.

In accordance with another aspect of the present disclosure, there is provided a hydrophobicizing method of heating, by a vaporizing surface heating unit, a vaporizing surface forming member of which surface is located in a vaporizing room; supplying a liquid chemical for a hydrophobicizing process on the surface of the vaporizing surface forming member through a liquid chemical supply port; introducing a carrier gas into the vaporizing room through a gas inlet port; supplying a hydrophobicizing gas vaporized in the vaporizing room through an outlet port; mounting a substrate in a processing chamber; and performing the hydrophobicizing process on the substrate by the hydrophobicizing gas supplied through the outlet port.

The hydrophobicizing method may further include diffusing the liquid chemical into a groove formed in the vaporizing surface forming member by a capillary action; and heating the carrier gas by a gas heating unit before the carrier gas is introduced into the vaporizing room. Further, the hydrophobicizing method may further include detecting a concentration of the hydrophobicizing gas supplied through the outlet port by a concentration detector; and increasing a flow rate of the liquid chemical supplied to the vaporizing room through the liquid chemical supply port based on a detection value of the concentration detector. In this case, the hydrophobicizing method may further include increasing a heating temperature of the vaporizing surface heating unit when the detection value of the concentration detector is lower than a setting value even after the flow rate of the liquid chemical is increased.

In accordance with still another aspect of the present disclosure, there is provided a storage medium for storing therein a computer program to be used for a hydrophobicizing apparatus that supplies a hydrophobicizing gas onto a substrate within a processing chamber. Here, the computer program may include a processing step group for performing the above-mentioned hydrophobicizing method.

In accordance with the present disclosure, since the liquid chemical for the hydrophobicizing process is supplied to and diffused on the heated vaporization surface forming part and the liquid chemical is vaporized, the hydrophobicizing gas of the high concentration can be obtained. Accordingly, unlike in a case of using a tank, contact between the liquid chemical and the carrier gas can be avoided when the vaporization is not performed. Thus, degradation of the liquid chemical can be suppressed. Further, since the tank is not used, scale-down of the apparatus can be achieved. In addition, a smaller amount of carrier gas may be used due to high vaporization efficiency. Furthermore, since a hydrophobicizing gas generating part (vaporizing device) can be scaled down, the hydrophobicizing gas generating part can be placed at a ceiling portion of the processing chamber, and a pipe connecting the hydrophobicizing gas generating part and the processing chamber can be shortened. Thus, even when a high-concentration hydrophobicizing gas is flown in the pipe, condensation can be avoided.

BRIEF DESCRIPTION OF THE DRAWINGS

The disclosure may best be understood by reference to the following description taken in conjunction with the following figures.

DETAILED DESCRIPTION OF THE INVENTION

Figure 1:
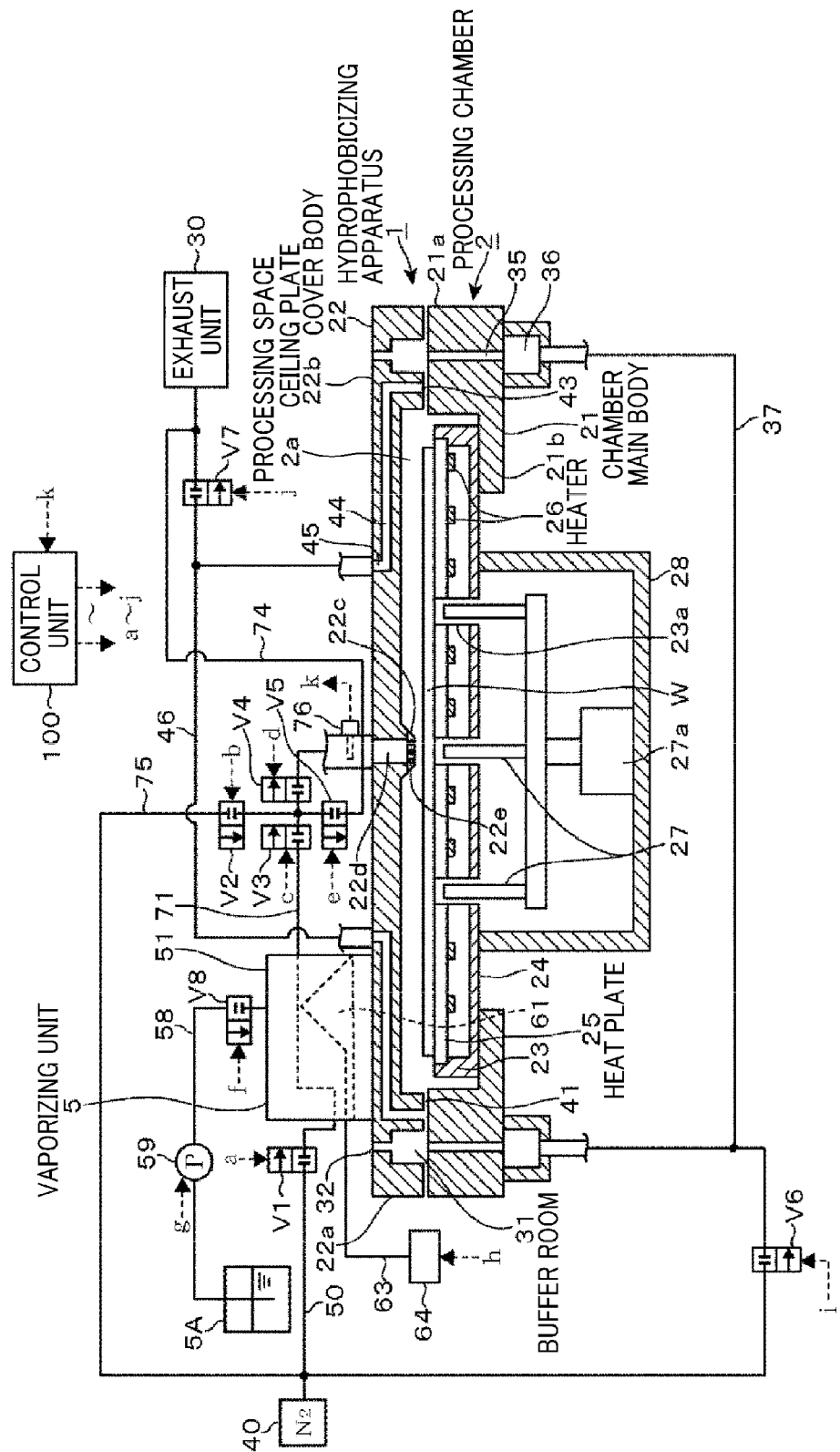
FIG. 1 is a cross sectional view illustrating a hydrophobicizing apparatus in accordance with the present disclosure.

Hereinafter, embodiments of a hydrophobicizing apparatus in accordance with the present disclosure will be described with reference to the accompanying drawings. A hydrophobicizing apparatus 1 includes, as illustrated in FIG. 1, a processing chamber 2 configured to perform a hydrophobicizing process on a substrate such as a wafer W; and a vaporizing unit (vaporizing device) 5 configured to generate a HMDS gas (hydrophobicizing gas) to be introduced into processing chamber 2. The hydrophobicizing apparatus 1 is hermetically accommodated in a non-illustrated housing.

The processing chamber 2 includes a chamber main body 21 having an open top; and a cover body 22 installed to close the open top. The chamber main body 21 includes a sidewall 21a and a bottom 21b. A mounting table 23 for a wafer W is supported by the bottom 21b of the chamber main body 21. In the processing chamber 2 in accordance with the present embodiment, the bottom 21b is extended to a region supporting a peripheral portion of the mounting table 23. Accordingly, in the present embodiment, the mounting table 23 is configured to form a part of the chamber main body 21. The mounting table 23 includes a flat cylindrical shaped supporting member 24 having a bottom; and a heat plate 25 supported by the supporting member 24 so as to close a top portion of the supporting member 24. The heat plate 25 has heaters 26 on its rear surface side. Further, the heat plate 25 has a non-illustrated temperature measuring unit, and a control unit 100 to be described later controls a temperature of the heaters 26 based on an output of the temperature measuring unit.

The cover body 22 includes a sidewall 22a and a ceiling plate 22b. A top surface of the sidewall 21a which is a peripheral portion of the chamber main body 21 and a bottom surface of the sidewall 22a which is a peripheral portion of the cover body 22 are aligned and brought close to each other, so that the open top of the chamber main body 21 is closed by the cover body 22 and a processing space 2a is formed. Within the processing space 2a formed as described above, a distance from a wafer mounting surface of the mounting table 23 to a bottom surface of the ceiling plate 22b of the cover body 22 is set to be, e.g., about 3 mm to about 10 mm.

The chamber main body 21 and the cover body 22 are configured to be movable up and down with respect to each other. To elaborate, the cover body 22 is configured to be moved up and down by a non-illustrated elevating mechanism between a processing position where the cover body 22 is in contact with the chamber main body 21 and a substrate loading/unloading position where the cover body 22 is located above the chamber main body 21. Further, the mounting table 23 is provided with a plurality of elevating pins 27 for transferring the wafer W between a non-illustrated external transfer mechanism and the mounting table 23. The elevating pins 27 are configured to be movable up and down by an elevating mechanism 27a through respective through holes 23a formed in the mounting table 23. As the elevating pins 27 are moved up, the wafer W on the mounting table 23 is separated from the mounting table 23. Further, the elevating pins 27 are enclosed by a cover 28 provided on a rear surface side of the mounting table 23.

Figure 2:
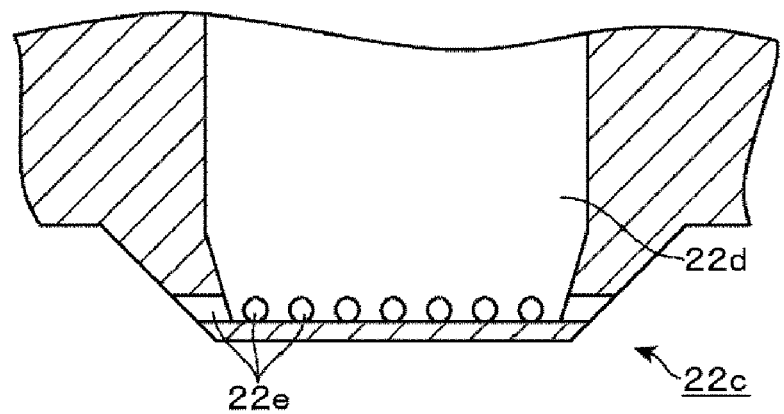
FIG. 2 provides a detailed view of a gas supply pathway of the hydrophobicizing apparatus.

A gas supply unit 22c through which a HMDS gas is introduced into the processing space 2a is provided in, e.g., a central portion of the ceiling plate 22b, and the vaporizing unit 5 is installed on the ceiling plate 22b. The gas supply unit 22c is a cylindrical member provided with a gas flow path 22d, as illustrated in FIG. 2. The gas supply unit 22c has a substantially trapezoidal cross sectional shape in a vertical direction of the gas flow path 22d. That is, the cross sectional shape of the gas supply unit 22c is gradually narrowed downward from the ceiling plate 22b. Further, a multiple number of supply holes 22e having a diameter of, e.g., about 0.5 mm to about 2 mm are formed in a lateral surface of a lower end of the gas supply unit 22c. The supply holes 22e are arranged at a certain distance along a circumferential direction of the gas supply unit 22c.

Further, provided in the sidewall 22a of the cover body 22 is a buffer room 31 which is a ring-shaped continuous space. The buffer room 31 is provided along a circumferential direction of the processing space 2a, and a bottom of the buffer room 31 is opened toward the chamber main body 21. The buffer room 31 serves to temporarily store a supplied purge gas (a $N_2$ gas in the present embodiment). In FIG. 1, a reference numeral 32 denotes outlet paths for the purge gas. Each outlet path 32 is extended upward from the buffer room 31 through the cover body 22. A plurality of outlet paths 32 is provided at a certain distance along the circumferential direction of the processing space 2a. When a purge gas is oversupplied into the buffer room 31, these outlet paths 32 serve to exhaust the oversupplied purge gas in the buffer room 31 to the outside.

A plurality of purge gas supply paths 35 through which the purge gas is supplied into the buffer room 31 is vertically formed through the sidewall 21a of the chamber main body 21 along the circumferential direction of the chamber main body 21. Connected to the purge gas supply paths 35 is a ring-shaped gas supply room 36 formed on a bottom surface side of the chamber main body 21 along the circumferential direction of the chamber main body 21. Connected to the gas supply room 36 is one end of a purge gas supply pipe 37, and the other end of the purge gas supply pipe 37 is connected with a gas supply source 40 storing the $N_2$ (nitrogen) gas via a valve V6.

Moreover, when the chamber main body 21 and the cover body 22 are brought close to each other in order to perform a hydrophobicizing process on the wafer W, a ring-shaped continuous gap through which the purge gas in the buffer room 31 is supplied toward the processing space 2a is formed between the chamber main body 21 and the cover body 22. This gap serving as a purge gas supply hole 41 is communicated with the buffer room 31 and is provided along a circumferential direction of the buffer room 31. The purge gas supply hole 41 is positioned slightly higher than a top surface of the mounting table 23.

Further, the cover body 22 is provided with a plurality of exhaust holes 43 through which the HMDS gas and the $N_2$ gas supplied into the processing space 2a are exhausted. The plurality of exhaust holes 43 are opened above the purge gas supply hole 41 at a certain distance along the circumferential direction. Further, the cover body 22 is provided with a ring-shaped cavity 44 communicating with the exhaust holes 43 and the cavity 44 is extended horizontally within the cover body 22. Along the circumferential direction of the cover body 22, a plurality of exhaust holes 45 is formed in a top surface of the cover body 22 at an inner circumferential side of the cavity. One end of an exhaust pipe 46 is connected to the exhaust hole 45, and the other end of the exhaust pipe 46 is connected to an exhaust unit 30 having, e.g., an exhaust pump via a valve V7.

Now, the vaporizing unit 5 will be explained with reference to FIGS. 3 and 4. The vaporizing unit 5 includes a housing 51, and the housing 51 is installed on the ceiling plate 22b of the cover body 22. The inside of the housing 51 is divided into a gas heating room 52 for heating an introduced $N_2$ gas and a vaporizing room 53 for vaporizing a supplied HMDS liquid. The gas heating room 52 and the vaporizing room 53 are arranged in a horizontal direction. An opening 54 through which the $N_2$ gas is introduced into the gas heating room 52 is provided at, for instance, a lateral lower portion of the gas heating room 52. In the drawings, a reference numeral 55 refers to a flow path serving as a gas inlet port. The flow path 55 is provided in a horizontal direction so as to connect the gas heating room 52 and the vaporizing room 53. In the drawings, a reference numeral 56 denotes a gas flow regulating member serving to regulate a flow of the $N_2$ gas in the gas heating room 52 so as to allow the $N_2$ gas to be sufficiently heated by a heating block 61 to be described later.

Connected to the opening 54 is one end of a gas supply pipe 50, and the other end of the gas supply pipe 50 is connected to the $N_2$ gas supply source 40 via a valve V1. The valve V1, valves V2 to V5 and V8 to be described later, and the above-described valves V6 and V7 have an opening/closing function and a flow rate control function, and they serve to control a flow rate of a gas or a liquid flown toward a downstream side in response to a control signal outputted from the control unit 100. Further, although not shown in FIG. 1 for the simplicity of explanation, the gas supply pipe 50 between the valve V1 and the vaporizing unit 5 is wound around a lateral side of the mounting table 23. The gas supply pipe 50 is heated by the heat plate 25, and the $N_2$ gas supplied from the $N_2$ gas supply source 40 is heated by the gas supply pipe 50 until the $N_2$ gas reaches the vaporizing unit 5.

Referring back to FIGS. 3 and 4, the heating block 61 is extended over the gas heating room 52 and the vaporizing room 53. Heating wires 62 serving as a vaporizing surface heating unit are embedded in the heating block 61, and the entire heating block 61 is heated by the heating wires 62. In FIG. 3, a reference numeral 63 denotes a power cable, and a reference numeral 64 denotes a power controller for controlling a power to be supplied to the heating wires 62 in response to a control signal from the control unit 100, as will be described later.

Further, in the vaporizing room 53, the heating block 61 has a conic member 65 serving as a vaporizing surface forming member. A multiple number of grooves 66 are formed in a surface of the conic member 65 from a top toward a bottom of the conic member 65. When the HMDS liquid is supplied to the top of the conic member 65, the grooves 66 allow the HMDS liquid to be diffused to the bottom by a capillary action, as will be described later. As the HMDS liquid is diffused to the bottom of the conic member 65, a contact area between the HMDS liquid and the $N_2$ gas supplied toward the conic member 65 is increased, thus increasing a supply amount of a HMDS gas into the processing chamber 2. In the vaporizing unit 5, since a concentration of the HMDS gas supplied to the wafer W may be controlled depending on a temperature of the heating block 61, the heating block 61 may be made of a material such as aluminum or SUS having high heat conductivity and small heat capacity. Further, the surface of the conic member 65 may be formed of DLC (Diamond- Like Carbon) or coated with nickel by electroless plating, so that wetting property of the surface of the conic member 65 can be improved, and, thus the HMDS liquid can be easily diffused.

Figure 3:
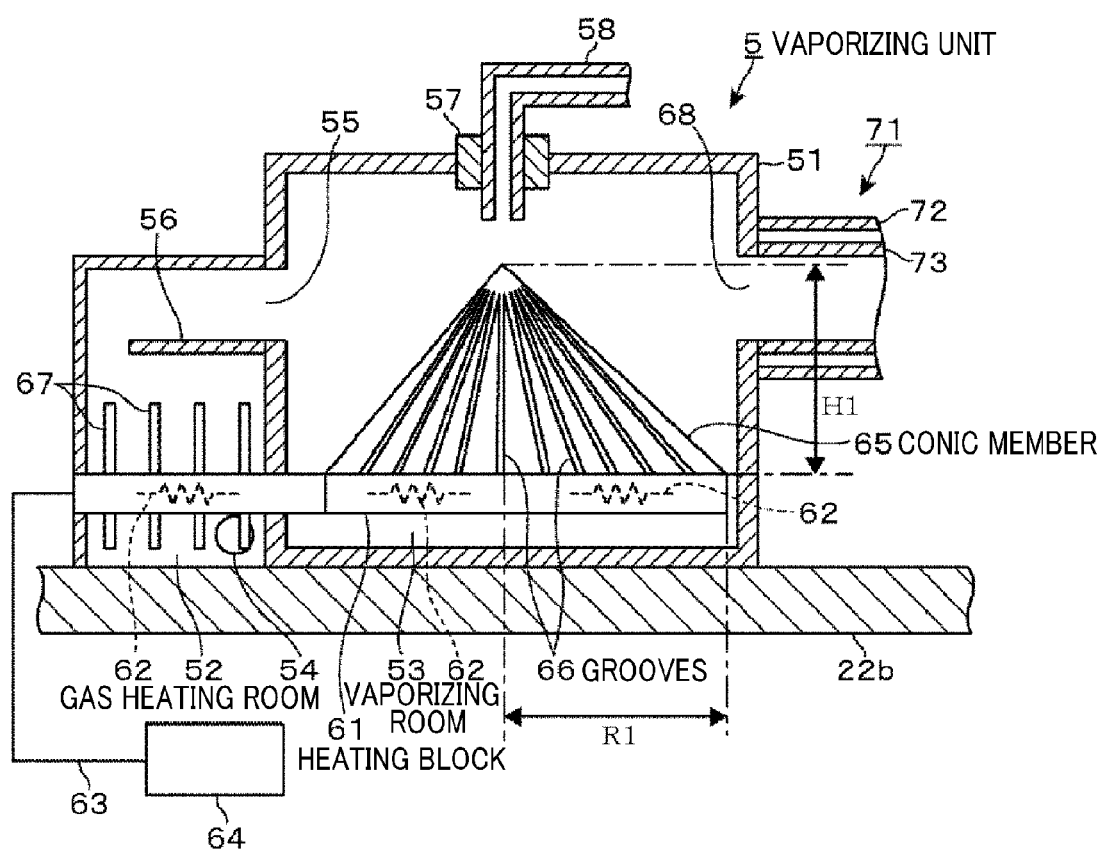
FIG. 3 is a longitudinal cross sectional view of a vaporizing unit installed in the hydrophobicizing apparatus.
Figure 4:
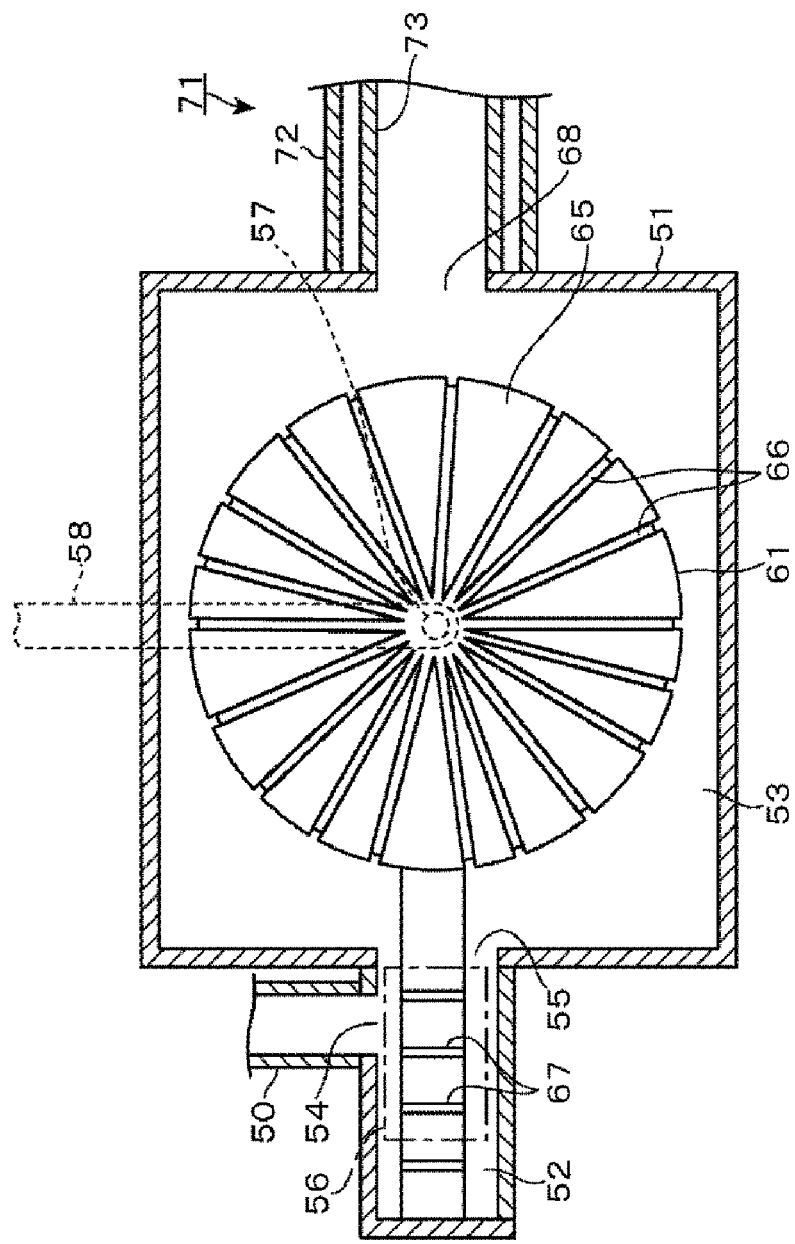
FIG. 4 is a transversal cross sectional view of the vaporizing unit.
Figure 5:
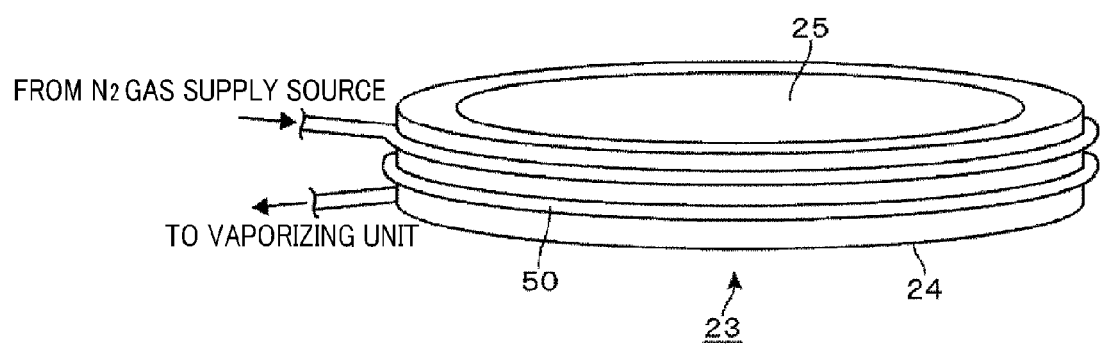
FIG. 5 is a perspective view illustrating a configuration example of a pipeline of the hydrophobicizing apparatus.

In FIG. 3, as a height H1 of the conic member 65 or a radius R1 of the bottom of the conic member 65 increases, the contact area between the $N_2$ gas and the HMDS liquid would also increase, thus increasing a supply amount of HMDS gas. If, however, the R1 is excessively long, the vaporizing unit 5 may not be mounted on the cover body 22, and, thus, the vaporizing unit 5 may be separated from the processing chamber 2. In such a case, condensation of the HMDS gas may be caused. Meanwhile, if the H1 is excessively long, the number of hydrophobicizing apparatuses 1 capable of being installed in a coating and developing apparatus or the like may be limited. Accordingly, a size of the conic member 65 may be properly designed in consideration of a balance in these matters. By way of example, the height H1 may be in the range of about 10 mm to about 15 mm, and the radius R1 may be in the range of about 25 mm to about 30 mm. A width of each groove 66 may be in the range of about 3 mm to about 5 mm.

In the gas heating room 52, the heating block 61 is provided with a plurality of vertically extending fins 67. Accordingly, the $N_2$ gas flowing from the gas heating room 52 toward the vaporizing room 53 can be efficiently heated by the fins 67.

At a ceiling of the vaporizing room 53, one end of a HMDS liquid supply pipe 58 fixed by a fixing member 57 is opened toward the top of the conic member 65. The one end of the HMDS liquid supply pipe 58 serves as a liquid chemical supply port and may be made of a material having high liquid repellency, high heat resistance and high corrosion resistance such as polytetrafluoroethylene (trade mark: Teflon), boron nitride, or the like. Further, as shown in FIG. 1, the other end of the HMDS liquid supply pipe 58 is connected to a HMDS liquid supply source 5A via a valve V8 and a pump 59. The valve V8 is a suck back valve serving to prevent a small amount of surplus HMDS liquid from being flown to a downstream side when the supply of the HMDS liquid is stopped. The pump 59 functions to supply the HMDS liquid from the HMDS supply source 5A to the downstream side, and an operation timing of the pump 59 is controlled by the control unit 100.

An opening 68 serving as a gas outlet port is formed in a sidewall of the vaporizing room 53 opposite from a sidewall at which the flow path 55 is formed. Connected to the opening 68 is one end of a gas supply pipe 71. The other end of the gas supply pipe 71 is connected to the gas flow path 22d of the processing chamber 2 via valves V3 and V4 in sequence, as illustrated in FIG. 1. Further, a concentration sensor 76 is installed at a rear end of the valve V4 on the gas supply pipe 71. The concentration sensor 76 detects a HMDS concentration within the gas supply pipe 71 and outputs a signal to the control unit 100 based on the detected concentration. Further, the gas supply pipe 71 is configured to have high heat insulating property so as to prevent condensation of the HMDS in the gas supply pipe 71. To elaborate, the gas supply pipe 71 has a double tube structure as shown in FIG. 3, and a vacuum is maintained between an outer pipe 72 and an inner pipe 73. Further, an external surface of the gas supply pipe 71 may be coated with a heat insulating material such as foam Teflon or glass wool.

One end of a pipe 75 and one end of a pipe 74 are respectively connected to the gas supply pipe 71 between the valves V3 and V4. The other end of the pipe 75 is connected to the $N_2$ gas supply source 40 via a valve V2, and the other end of the pipe 74 is connected to the exhaust unit 30 via a valve V5.

Now, the control unit 100 will be explained. The control unit 100 for controlling the hydrophobicizing apparatus 1 may be implemented by, e.g., a computer, and the control unit 100 includes a program, a memory, a CPU, and so forth. The program includes commands (processing steps) for sending a control signal from the control unit 100 to each component of the hydrophobicizing apparatus 1 so as to allow a preset hydrophobicizing process to be carried out. The program is stored in a storage unit such as a flexible disk, a compact disk, a hard disk, or a MO (Magneto Optical) disk and can be executed by the control unit 100. This program also includes programs for controlling the elevating mechanism of the cover body 22, the exhaust unit 30, the valves V1 to V8 and so forth, and these programs are executed to control each component of the hydrophobicizing apparatus 1 according to a process recipe previously stored in the memory of the control unit 100.

Further, a user can set a concentration of the HMDS supplied to the wafer W through a non-illustrated setting means, and a setting value is stored in the memory. As will be described later, a control is performed such that the HMDS concentration detected by the concentration sensor 76 reaches the setting value. Further, a HMDS concentration tolerance range as a threshold value for raising an alarm can be set by the setting means. When the HMDS concentration detected by the concentration sensor 76 falls out of the tolerance range, an alarm indicating such a deviation of the HMDS concentration from the tolerance range is displayed on a non-illustrated display screen installed in the control unit 100.

Now, a hydrophobicizing method performed in the hydrophobicizing apparatus 1 in accordance with an embodiment of the present disclosure will be explained with reference to FIG. 6 and FIG. 7 respectively illustrating gas flow in the vaporizing unit 5 and gas flow in the processing chamber 2. First, a user of the hydrophobicizing apparatus 1 sets a concentration of HMDS contained in a gas supplied onto a wafer W by the setting means, and selects a process recipe for supplying the HMDS based on the setting value. Further, the user sets a tolerance range as a threshold value for raising the aforementioned alarm. In the present embodiment, the user may set the concentration of the HMDS contained in the gas supplied onto the wafer W to be about 3.0%, and the tolerance range to be from about 1.5% to about 5%.

According to the process recipe, a control signal is outputted to each component of the hydrophobicizing apparatus 1 from the control unit 100, and the heat plate 25 of the mounting table 23 is heated by the heaters 26 to a preset temperature. The supporting member 24 is heated by the heat plate 25, and, thus, the gas supply pipe 50 wound around the supporting member 24 is also heated. At this time, the valves V1 to V8 are all closed.

Subsequently, a temperature of the heating block 61 of the vaporizing unit 5 increases and reaches a setting temperature of, e.g., about 80° C. to about 90° C. Further, the pump 59 is operated and the valve V8 is opened, so that a HMDS liquid is supplied through the HMDS liquid supply pipe 58 to the top of the conic member 65 in the vaporizing room 53 at a flow rate specified in the selected recipe, and the supplied HMDS liquid is then heated by the conic member 65. Since the conic member 65 is provided with a multiple number of grooves 66 extended from the top toward the bottom thereof, the HMDS liquid gets rapidly diffused toward the bottom of the conic member 65 by a capillary action in the grooves 66 and the force of the gravity while the HMDS liquid is being heated.

Almost concurrently with the supply of the HMDS liquid, the cover body 22 is raised up to the substrate loading/unloading position, and the wafer W is loaded into the processing space 2a by a non-illustrated external transfer mechanism. Then, the wafer W is mounted on the mounting table 23 by the transfer mechanism and the elevating pins 27. Thereafter, by lowering the cover body 22 to the processing position, the processing space 2a is formed between the chamber main body 21 and the cover body 22, as illustrated in FIGS. 1 and 7. After the wafer W is mounted on the mounting table 23, the wafer W is heated to a preset processing temperature, e.g., about 85° C.

After it is detected by a temperature measuring unit that the wafer W is heated to the processing temperature, for example, the valves V1, V3 and V4 are opened, and a $N_2$ gas of a room temperature supplied from the gas supply source 40 is flown through the gas supply pipe 50 to the downstream side at a preset flow rate. Substantially at the same time these valves V1, V3 and V4 are opened, the valve V6 is opened, and a $N_2$ gas as a purge gas is supplied from the gas supply source 40 into the buffer room 31 via the gas supply pipe 37 and the gas supply room 36 at a bottom of the processing chamber 2. Further, the valve V7 is opened, and gas is exhausted through the exhaust holes 43 of the processing chamber 2.

The $N_2$ gas as a carrier gas supplied into the gas supply pipe 50 is supplied into the gas heating room 52 of the vaporizing unit 5 while the $N_2$ gas is being heated by the gas supply pipe 50 heated by the heat plate 25. While the $N_2$ gas flows from the gas heating room 52 toward the vaporizing room 53, the $N_2$ gas is further heated by the heating block 61 and its temperature reaches, e.g., about 50° C. to about 80° C.

Figure 6:
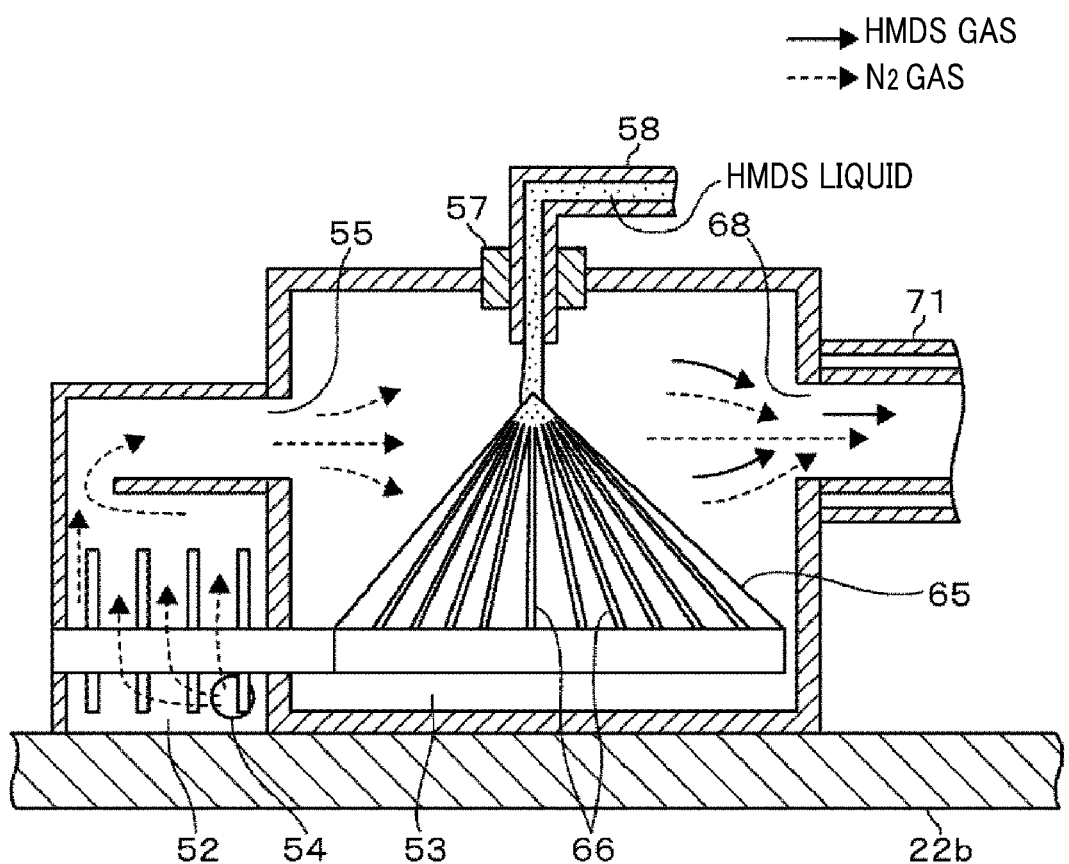
FIG. 6 illustrates a gas flow in the heating unit.
Figure 7:
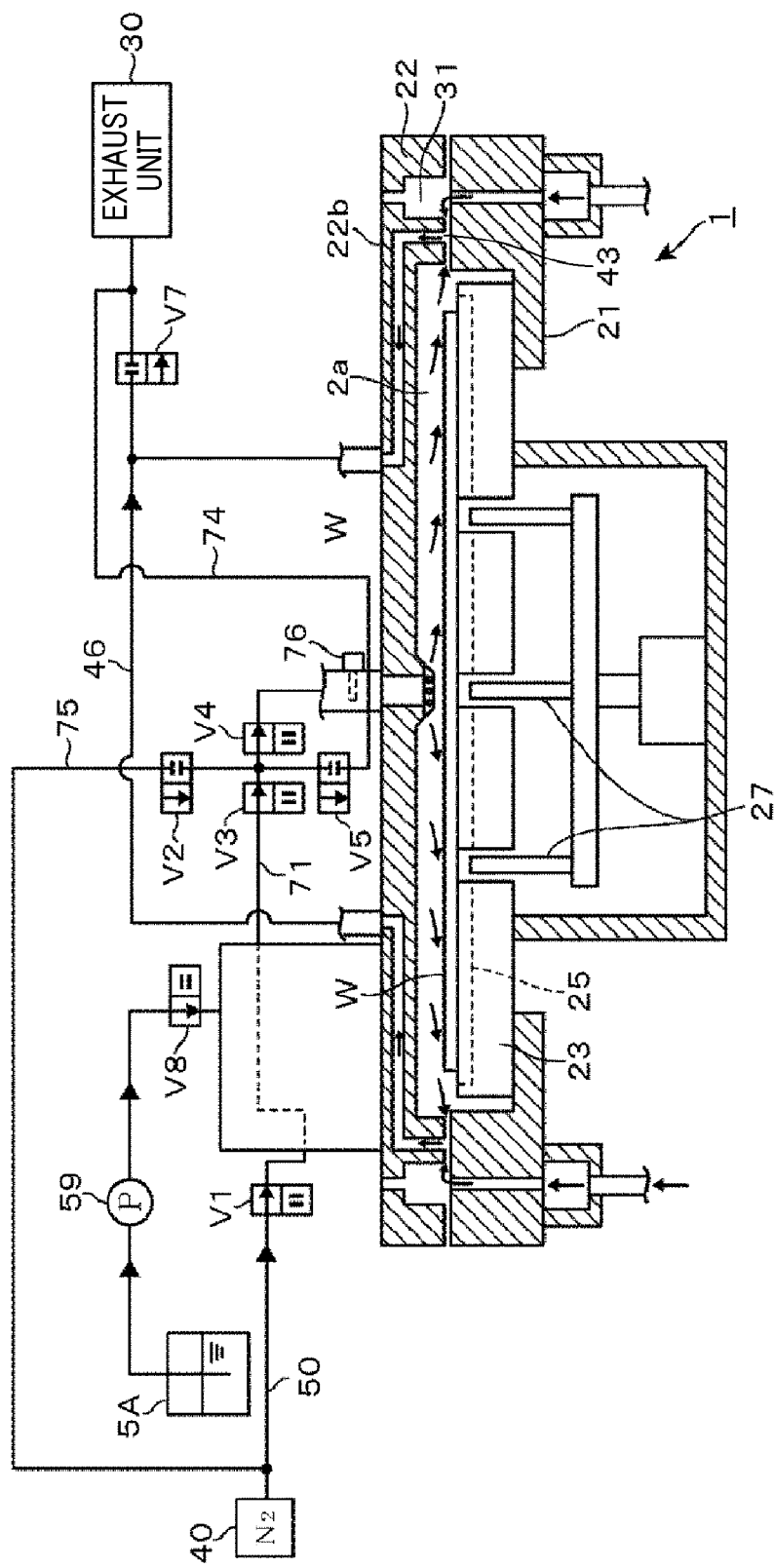
FIG. 7 illustrates a gas flow in a processing chamber of the hydrophobicizing apparatus.

Then, the heated $N_2$ gas is sprayed to the conic member 65, as illustrated by dotted-line arrows in FIG. 6. The HMDS liquid is vaporized by the heat of the conic member 65, and such vaporization of the HMDS liquid within the vaporizing room 53 is further facilitated by the heated $N_2$ gas. Further, since the carrier gas is heated, condensation of the vaporized HMDS can be prevented. The vaporized HMDS gas with the $N_2$ gas is then supplied into a central portion of the processing space 2a via the gas supply pipe 71, the gas flow path 22d and the supply holes 22e. The HMDS gas and the $N_2$ gas are diffused to a peripheral portion of the processing space 2a by a suction force of the exhaust holes 43, as illustrated by arrows in FIG. 7, so that the inside of the processing space 2a is filled with these gases. The entire surface of the wafer W is exposed to the HMDS, and, thus, a hydrophobicizing process of the wafer W is performed.

During the hydrophobicizing process, a gas supply amount and a gas exhaust amount are controlled such that the gas exhaust amount by the exhaust unit 30 is greater than a sum of a supply amount of the $N_2$ gas supplied into the buffer room 31 of the cover body 22 as the purge gas and a supply amount of the $N_2$ gas supplied into the processing space 2a as the carrier gas. For the reason, the purge gas in the buffer room 31 is sucked toward the processing space 2a through the gap 41 and is exhausted through the exhaust holes 43 together with a gas flowing from the processing space 2a toward the exhaust holes 43. As described, since an air current of the purge gas is always introduced into the purge gas supply hole 41 so as to surround the processing space 2a, an air curtain of the purge gas is formed around the processing space 2a, and, thus, the processing space 2a is isolated from the outside by the air curtain. Accordingly, although the processing space 2a is not hermetically sealed, a leakage of the hydrophobicizing gas from the processing space 2a to the outside can be prevented.

Figure 8:
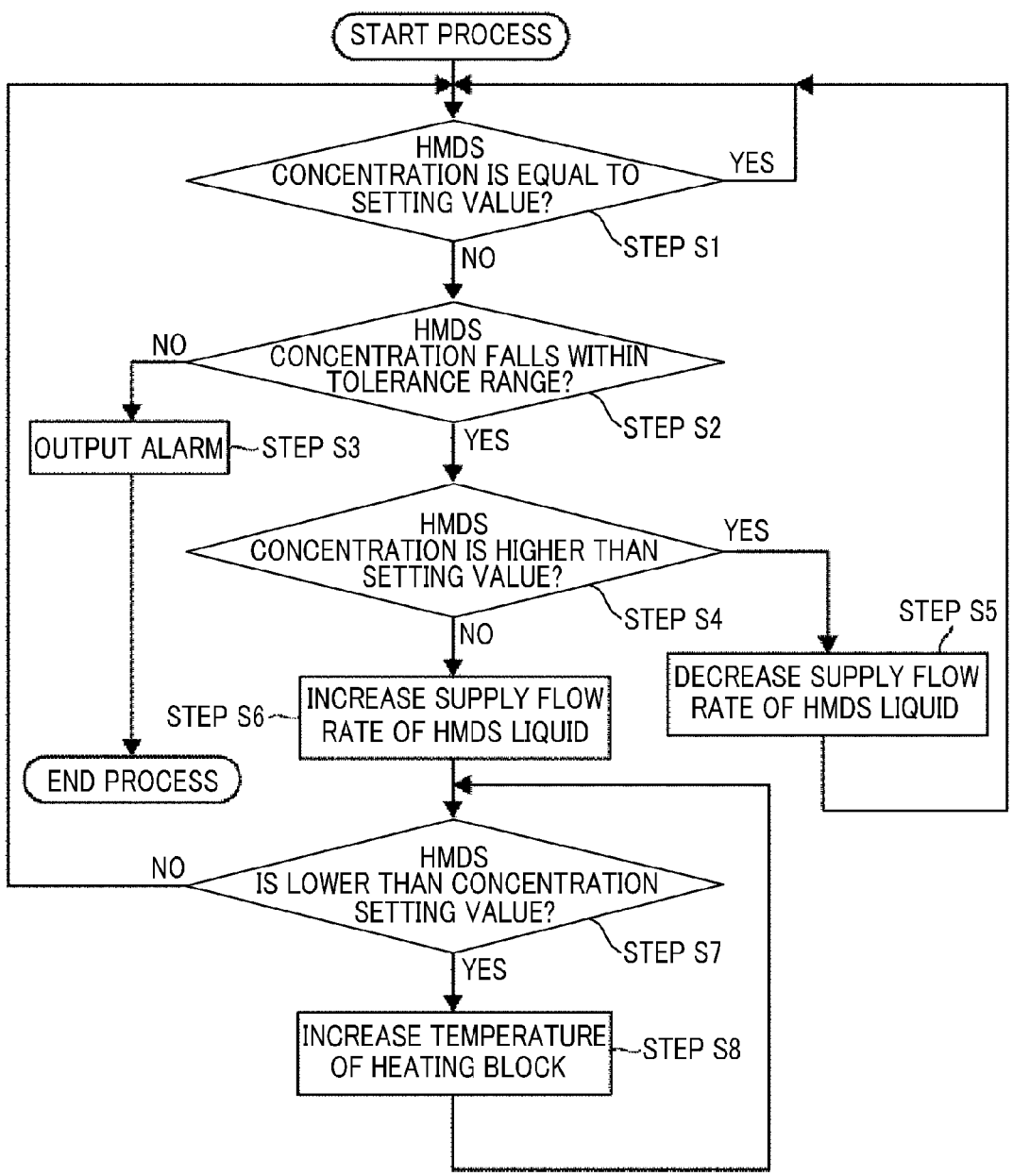
FIG. 8 is a flowchart showing a sequence of a hydrophobicizing process performed in the hydrophobicizing apparatus.

Referring to a flowchart of FIG. 8, after a lapse of a preset time from when the supply of the HMDS liquid is begun by opening the valve V8, the control unit 100 detects a HMDS concentration in the gas flowing through the gas supply pipe 71 from an output signal sent from the concentration sensor 76 and determines whether or not the detected HMDS concentration is equal to the setting value (in this embodiment, about 3.0% as mentioned above) (step S1). If the HMDS concentration detected in step S1 is found to be equal to the setting value, the control unit 100 repeatedly determines whether the HMDS concentration is equal to the setting value.

If the detected HMDS concentration is found to be unequal to the setting value, the control unit 100 determines whether or not the HMDS concentration falls within the tolerance range (in the present embodiment, about 1.5% to about 5% as stated above) (step S2). If the detected HMDS concentration is found to be out of the tolerance range, the control unit 100 displays an alarm on the display screen (step S3). If the detected HMDS concentration is found to be within the tolerance range, on the other hand, the control unit 100 determines whether or not the detected HMDS concentration is higher than the setting value (step S4). If it is found that the detected HMDS concentration is higher than the setting value, the control unit 100 sends a control signal to the valve V8 to reduce a flow rate of the HMDS liquid supplied to the vaporizing unit 5 by a certain amount (step S5). Then, after a lapse of a preset time from when the control signal is sent to the valve V8, the control unit 100 repeatedly performs the respective steps starting from step S1.

Further, if it is found in step S4 that the HMDS concentration is not higher than the setting value, the control unit 100 sends a control signal to the valve V8 to increase the flow rate of the HMDS liquid supplied to the vaporizing unit 5 by a certain amount (step S6). Then, after a lapse of a preset time from when the control signal is sent to the valve V8, the control unit 100 determines whether or not the HMDS concentration is lower than the setting value (step S7).

If it is found in step S7 that the HMDS concentration is not lower than the setting value, the control unit 100 repeatedly performs the respective steps starting from step S1. On the other hand, if it is found in step S7 that the HMDS concentration is lower than the setting value, the control unit 100 sends a control signal to the power controller 64 to increase the temperature of the heating block 61 by increasing a power supplied to the heating block 61 by a certain amount (step S8). If it is found that a preset time passes by after the control signal is sent, the control unit 100 repeatedly performs the respective steps starting from step S7.

Upon the completion of the hydrophobicizing process on the wafer W after a lapse of a preset time after the wafer W is loaded, the supply of the HMDS liquid is stopped by closing the valve V8 in the hydrophobicizing apparatus 1, and the control unit 100 stops the control of the power supplied to the heating block 61 and the flow rate of the HMDS liquid based on the detection of the concentration sensor 76. Then, the control unit 100 changes a flow path of the $N_2$ gas by closing the valve V1 and opening the valve V2, so that the $N_2$ gas is supplied into the processing space 2a without passing through the vaporizing unit 5. In the meantime, gases are continuously exhausted through the exhaust holes 43, and, thus, the $N_2$ gas and the HMDS gas remaining in the processing space 2a are sucked out. Accordingly, the gaseous mixture of the HMDS gas and the $N_2$ gas in the processing space 2a is substituted with the $N_2$ gas without containing the HMDS gas.

If a preset time passes by after the flow path of the $N_2$ gas is changed, the valves V2 and V4 are closed and the valves V1, V3 and V5 are opened, so that the flow path of the $N_2$ gas is changed again, and the $N_2$ gas is exhausted via the vaporizing unit 5 without passing through the processing chamber 2. Accordingly, the HMDS gas remaining in the gas heating room 52 and the vaporizing room 53 are exhausted by the $N_2$ gas. Then, if a preset time passes by after the flow path of the $N_2$ gas is changed, the valves V1, V3 and V5 are closed, and the wafer W is unloaded from the processing chamber 2 in the reverse sequence to that in which it is loaded into the processing chamber 2.

In accordance with the hydrophobicizing apparatus 1 of the above-described embodiment of the present disclosure, since the HMDS liquid is supplied and diffused onto the conic member 65 of the heating block 61 and this HMDS liquid is vaporized, a hydrophobicizing gas of HMDS having a high concentration can be obtained. Accordingly, unlike in a case of using a tank, a stored HMDS liquid is prevented from being in contact with the carrier gas while the vaporization is not being performed, and, thus, degradation of the HMDS liquid can be suppressed. Furthermore, the apparatus can be scaled down because a tank is not used, and a smaller amount of carrier gas can be used due to high vaporization efficiency. Moreover, since the vaporizing unit 5 can be reduced in size, the vaporizing unit 5 can be installed at the ceiling of the processing chamber 2. With such a configuration, since the gas supply pipe 71 for supplying the hydrophobicizing gas from the vaporizing unit 5 to the processing chamber 2 can be shortened, condensation of the hydrophobicizing gas can be suppressed even if the hydrophobicizing gas of HMDS having a high concentration is carried. In addition, since a heater in the gas supply pipe 71 need not be installed as a countermeasure of a HMDS condensation problem, scale-up of the apparatus 1 can be avoided.

Further, the conic member 65 is provided with the multiple number of grooves 66, and the HMDS liquid is diffused in the grooves 66 by the capillary action. Accordingly, since the contact area between the HMDS liquid and the $N_2$ gas as the carrier gas is increased, the vaporizing efficiency of the HMDS liquid can be further improved. Moreover, since the $N_2$ gas supply pipe 50 is heated by the heat plate 25 of the mounting table 23 and the $N_2$ gas to be introduced into the vaporizing room 53 is heated in the gas heating room 52 of the vaporizing unit 5, the vaporizing efficiency of the HMDS liquid can be further ameliorated.

Figure 9:
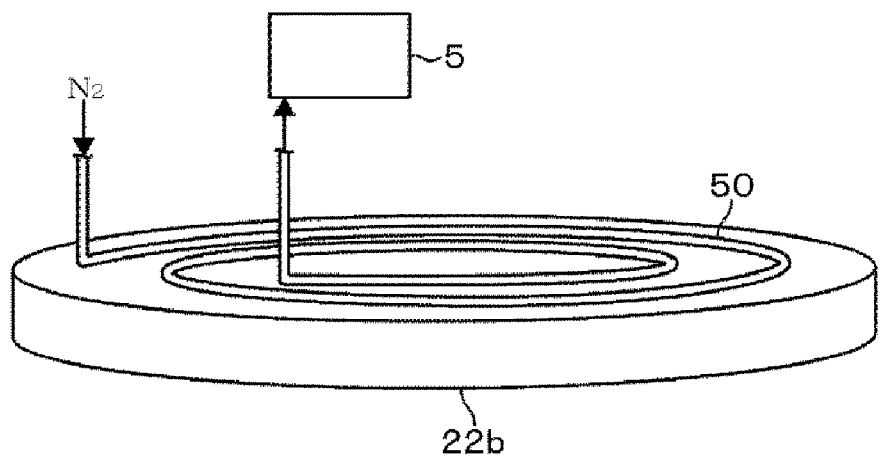
FIG. 9 is a perspective view illustrating another configuration example of the pipeline.

Further, in the above embodiment, the $N_2$ gas supply pipe 50 for supplying the $N_2$ gas to the vaporizing unit 5 may be provided on the ceiling plate 22b of the processing chamber 2, as illustrated in FIG. 9, instead of being wound around the mounting table 23. As the ceiling plate 22b is heated by the heat plate 25, the gas supply pipe 50 is heated, and the $N_2$ gas supplied into the vaporizing unit 5 is heated by the gas supply pipe 50. Likewise, the gas supply pipe 71 for connecting the vaporizing unit 5 and the processing chamber 2 may be provided on the ceiling plate 22b or wound around the mounting table 23.

Figure 10:
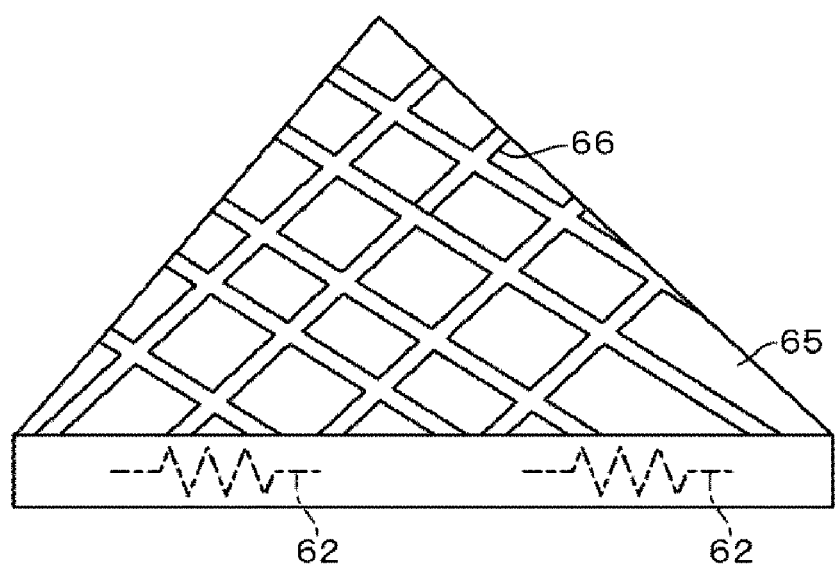
FIG. 10 is a side view illustrating another configuration example of a heating block of the heating unit.

Moreover, the grooves 66 formed in the conic member 65 may not be limited to the above-mentioned example. For example, the grooves may be formed diagonally, as illustrated in FIG. 10. Further, in the heating block 61, the part to which the HMDS liquid is supplied may be formed to have a shape other than the conic shape. In such a case, it may be desirable that the part be formed in a shape gradually enlarged downward so as to allow the HMDS liquid to be diffused by the force of the gravity as well as the capillary action, thus improving the vaporizing efficiency.

Figure 11:
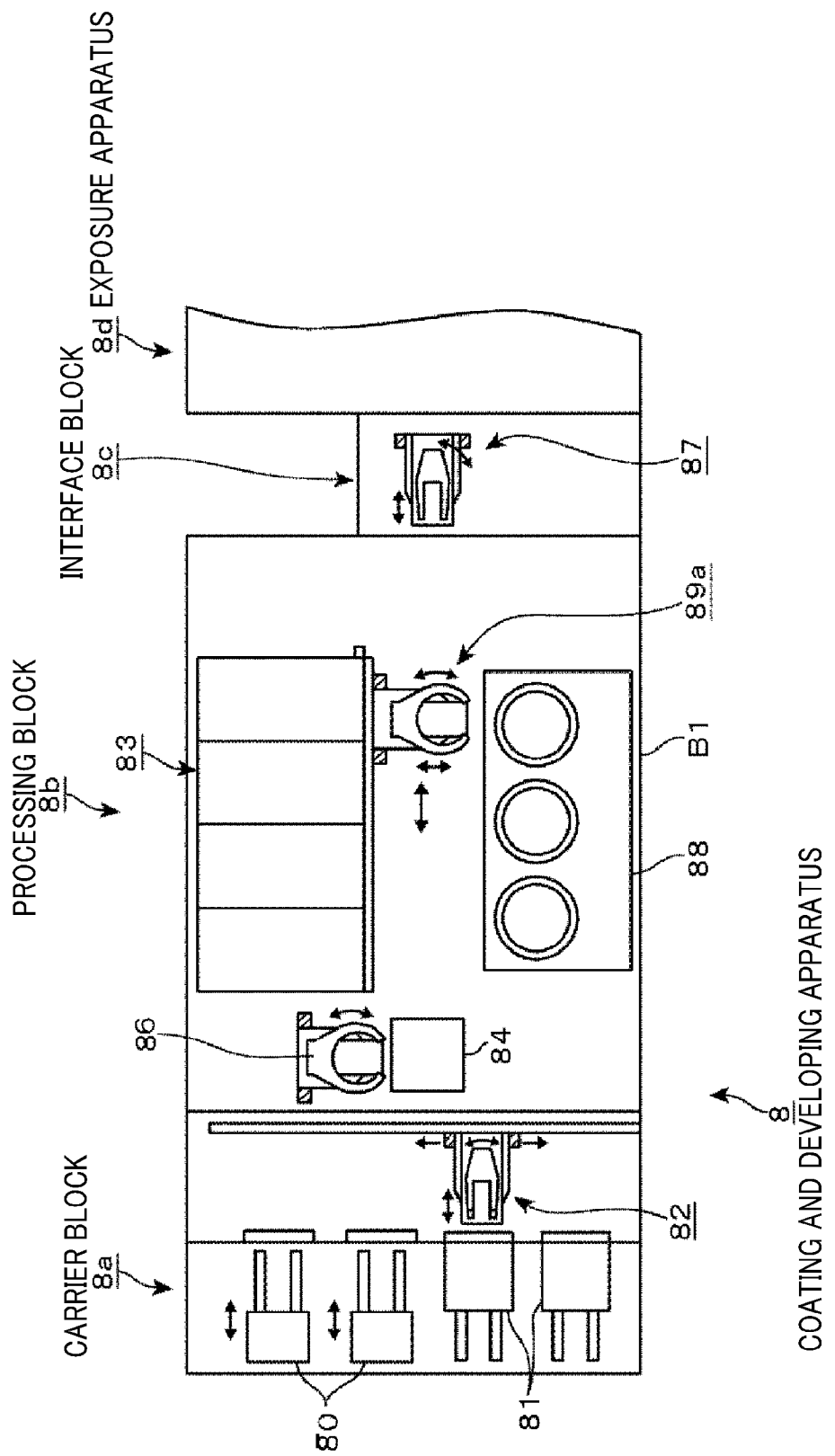
FIG. 11 is a plane view of a coating and developing apparatus equipped with the hydrophobicizing apparatus.
Figure 12:
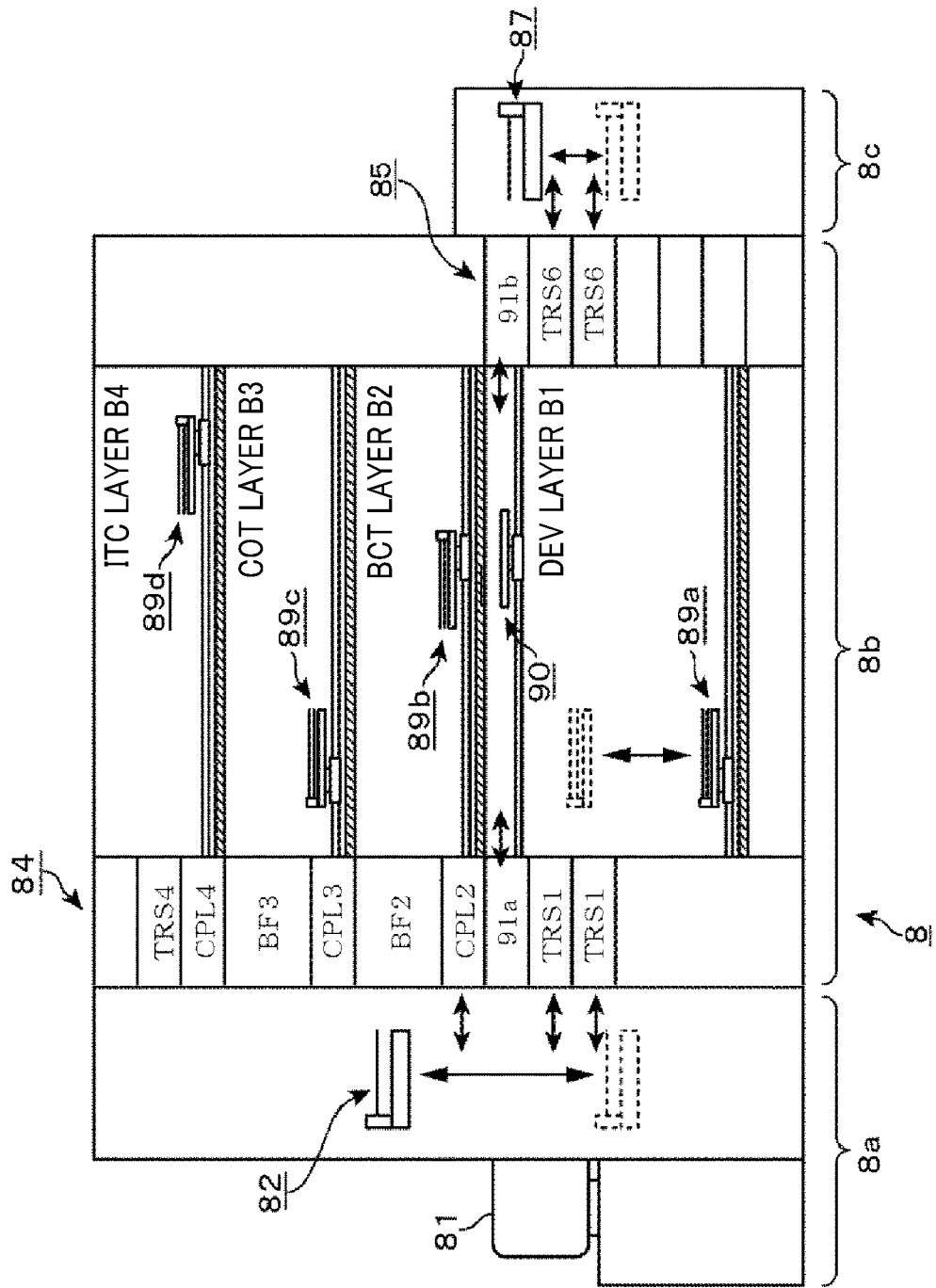
FIG. 12 is a longitudinal cross sectional view of the coating and developing apparatus.

Now, there will be explained briefly a resist pattern forming apparatus including a coating and developing apparatus 8 having the hydrophobicizing apparatus 1 in accordance with the embodiment of the present disclosure. As illustrated in FIGS. 11 and 12, the coating and developing apparatus 8 includes a carrier block 8a, a processing block 8b and an interface block 8c connected with each other in sequence. The resist pattern forming apparatus includes the coating and developing apparatus 8 and an exposure apparatus 8d which is connected with the coating and developing apparatus 8 and performs, e.g., a liquid immersion exposure process. In the carrier block 8a, a first transfer arm 82 takes out a wafer W from a hermetically sealed carrier 81 mounted on a mounting table 80 and transfers the wafer W to the adjacent processing block 8b. Further, the first transfer arm 82 receives a processed wafer W from the processing block and returns it back into the carrier 81.

The processing block 8b includes a first block (DEV layer) B1 that performs a developing process; a second block (BCT layer) B2 that performs an antireflection film forming process so as to form an antireflection film under a resist film; a third block (COT layer) B3 that performs a resist solution coating process; and a fourth block (ITC layer) B4 that performs an antireflection film forming process so as to form an antireflection film on the resist film. The respective blocks of the processing block 8b are stacked in sequence on top of each other. Further, installed in each of these blocks is a processing unit group 83 in which a heating unit or a cooling unit is stacked. The hydrophobicizing apparatus 1 is included in a processing unit group 83 of the third block B3.

In the processing block 8b, a first shelf unit 84 is installed on the side of the carrier block 8a and a second shelf unit 85 is installed on the side of the interface block 8c. A vertically movable second transfer arm 86 is installed in the vicinity of the first shelf unit 84 so as to transfer the wafer W between respective parts of the first shelf unit 84. Each of the first shelf unit 84 and the second shelf unit 85 is provided with a plurality of transfer units. Referring to FIG. 12, among these transfer units, each of transfer units assigned CPL includes a cooling unit for temperature control, and each of transfer units assigned BF includes a buffer unit capable of holding a plurality of wafers W. The interface block 8c has an interface arm 87, and the wafer W is transferred between the second shelf unit and the exposure apparatus 8d by the interface arm 87. The exposure apparatus 8d performs an exposure process on the wafer W transferred by the interface arm 87.

In the first block B1, developing units 88 are stacked in, e.g., two layers, and a transfer arm 89a is provided to transfer the wafer W to the two-layer developing units 88. Each of the second block B2 and the fourth block B4 includes a coating unit for coating the wafer W with a liquid chemical for forming an antireflection film by spin coating; and a processing unit group, including a heating and/or a cooling unit, for performing processes on the wafer W before and after a coating process performed by the coating unit. Further, transfer arms 89b and 89d are respectively installed between the coating unit and the processing unit group to transfer the wafer W therebetween. The third block B3 has the same configuration as those of the second and fourth blocks B2 and B4 except that the liquid chemical is a resist solution and the hydrophobicizing apparatus 1 in accordance with the embodiment of the present disclosure is included.

In the resist pattern forming apparatus configured as described above, in order to form a resist pattern on a wafer W, the wafer W is first transferred by the first transfer arm 82 from the carrier block 8a into a transfer unit of the first shelf unit 84, e.g., into a transfer unit CPL2 corresponding to the second block B2. Then, the wafer W is loaded into the third block B3 via a transfer unit CPL3 and a transfer arm 89c, and a resist film is formed on the wafer W after a surface of the wafer W is hydrophobicized by the hydrophobicizing apparatus 1. Thereafter, the wafer W is transferred into a transfer unit BF3 of the first shelf unit 84 by the transfer arm 89c. The wafer W transferred into the transfer unit BF3 is conveyed into a transfer unit CPL4 by the second transfer arm 86 and then is transferred into the fourth block B4 by the transfer arm 89d. In the fourth block B4, an antireflection film is formed on the resist film of the wafer W, and the wafer W is then transferred into a transfer unit TRS4. In this resist pattern forming apparatus, depending on requirements, the antireflection film may not be formed on the resist film, or the antireflection film may be directly formed on the wafer W in the second block B2 instead of performing the hydrophobicizing process on the wafer W.

Further, a shuttle 90 serving as a dedicated transfer mechanism for directly transferring the wafer W from a transfer unit 91a of the first shelf unit 84 to a transfer unit 91b of the second shelf unit 85 is installed in an upper portion of the first block B1. The wafer W on which the resist film or the antireflection film is formed is transferred from the transfer unit BF2 or BF3 or the transfer unit TRS4 into the transfer unit 91a by the second transfer arm 86, and then is transferred from the transfer unit 91a to the shuttle 90. Then, the wafer W is transferred into the transfer unit 91b by the shuttle 90.

The wafer W transferred into the transfer unit 91b by the shuttle 90 is then conveyed into the interface block 8c by the interface arm 87 of the interface block 8c and then is transferred into the exposure apparatus 8d. After an exposure process is performed on the wafer W by the exposure apparatus 8d, the wafer W is transferred into a transfer unit TRS6 of the second shelf unit 85 by the interface arm 87. Subsequently, the wafer W is transferred into the first block B1 by the transfer arm 89a, and a developing process is performed therein. After the completion of the developing process, the wafer W is transferred, by the transfer arm 89a, into a transfer unit to which the first transfer arm 82 is accessible among the transfer units of the first shelf unit, and then is conveyed into the carrier 81 by the first transfer arm 82. In this way, the resist pattern forming apparatus in accordance with the present embodiment forms the resist pattern on the wafer W.

(Reference Test)

A hydrophobicizing process was performed on a wafer W by using a hydrophobicizing apparatus having the above-described processing chamber 2. In Experiment 1, instead of connecting the above-described vaporizing unit 5 to the processing chamber 2, a vaporizing unit equipped with a tank for performing bubbling was connected to the processing chamber. Then, a wafer W was loaded into the processing chamber 2 and heated at about 90° C., and a hydrophobicizing process was performed by supplying a hydrophobicizing gas for about 30 seconds. During the hydrophobicizing process, a HMDS volumetric concentration was detected by the concentration sensor installed in the processing chamber 2. After an atmosphere within the processing chamber was substituted with an $N_2$ gas by supplying the $N_2$ gas for about 10 seconds upon the completion of the hydrophobicizing process, the wafer W was unloaded from the processing chamber 2 and a contact angle on a surface of the wafer W was measured.

In Experiment 2, the same experiment as Experiment 1 was conducted by using the same apparatus as that used in Experiment 1 except that a temperature of the tank for performing bubbling was set to be higher than a temperature of the tank in Experiment 1. In Experiment 3, a vaporizing unit configured to supply a carrier gas onto a surface of a HMDS liquid in a tank was connected to the processing chamber 2 instead of connecting the vaporizing unit having the tank for bubbling to the processing chamber 2, and the same process as those performed in Experiments 1 and 2 was conducted.

Figure 13:
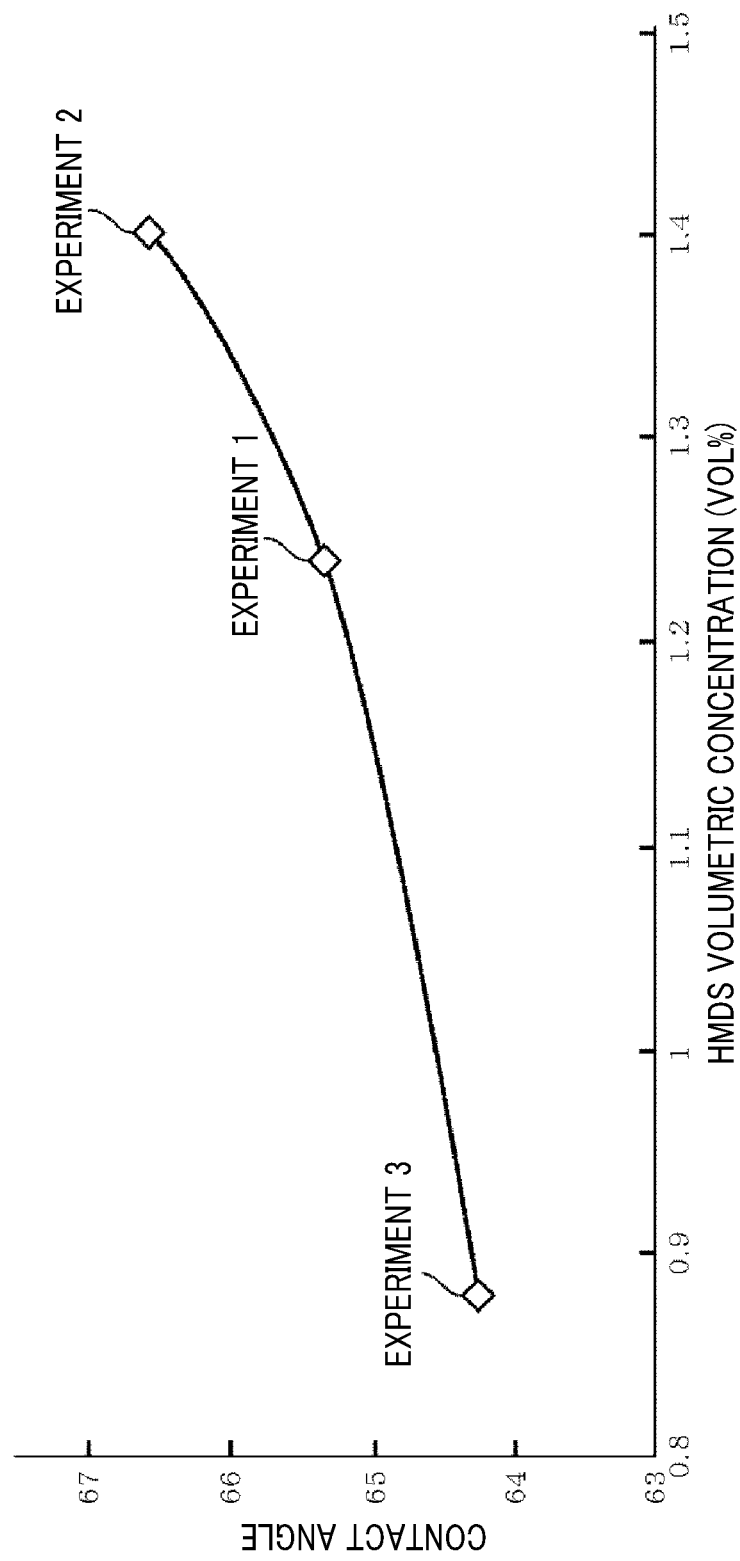
FIG. 13 is a graph showing a result of a reference test.

FIG. 13 is a graph showing experimental results. A vertical axis of the graph represents a contact angle, and a horizontal axis of the graph indicates a detected HMDS volumetric concentration. A higher contact angle may imply that the wafer W was more highly hydrophobicized. As can be seen from the graph, the contact angle of the wafer W increased with an increase of the HMDS concentration. Thus, it is proved that a throughput of the hydrophobicizing process can be improved by supplying HMDS of a high concentration into the processing chamber 2.

What is claimed is:

1. An apparatus comprising:
   a housing which is divided into a carrier gas heating room and a vaporizing room arranged in a horizontal direction;
   a vaporizing surface forming member of which surface is located in the vaporizing room;
   a heating block extending from the carrier gas heating room to the vaporizing room;
   a liquid chemical supply port that supplies a liquid chemical toward the surface of the vaporizing surface forming member in a vertical direction;
   a gas inlet port that introduces a carrier gas from the carrier gas heating room into the vaporizing room;
   an gas outlet port that supplies a processing gas vaporized in the vaporizing room; and
   a processing chamber that performs a process on a substrate accommodated therein by the processing gas supplied through the gas outlet port,
   wherein the gas inlet port and the gas outlet port are formed in a horizontal direction at substantially the same height.

2. The apparatus of claim 1, wherein the vaporizing room is provided on a ceiling plate of the processing chamber.

3. The apparatus of claim 1, wherein the vaporizing surface forming member is formed to have a shape enlarged downward, and the liquid chemical supply port is located above the vaporizing surface forming member.

4. The apparatus of claim 3, wherein the vaporizing surface forming member is provided with a groove in which the liquid chemical is to be diffused by a capillary action.

5. The apparatus of claim 1, further comprising:
   a concentration detector that detects a concentration of the processing gas supplied through the gas outlet port; and
   a control unit that outputs a control signal based on a detection value of the concentration detector so as to increase a flow rate of the liquid chemical supplied to the vaporizing room through the liquid chemical supply port.

6. The apparatus of claim 5, wherein the control unit outputs a control signal so as to increase a heating temperature of the heating block when the detection value of the concentration detector is lower than a setting value even after the flow rate of the liquid chemical is increased.

7. The apparatus of claim 1, a plurality of vertically extending fins are installed in the carrier gas heating room.

8. The apparatus of claim 7, a gas flow regulating member is installed in a horizontal direction above the plurality of vertically extending fins, and
   the width of the gas flow regulating member is broader than that of each of the plurality of vertically extending fins.

9. The apparatus of claim 1, an opening through which the carrier gas is introduced into the carrier gas heating room is formed at a lower portion of the carrier gas heating room.

10. The apparatus of claim 1, the surface of the vaporizing surface forming member is coated with DLC (Diamond-Like Carbon) or nickel by electroless plating.

* * * * *